(12) United States Patent
Heggemann et al.

(10) Patent No.: US 7,736,161 B2
(45) Date of Patent: Jun. 15, 2010

(54) STACKABLE ELECTRONIC HOUSING WITH MALE OR FEMALE CONNECTOR STRIPS

(75) Inventors: Christian Heggemann, Detmold (DE);
Jens Oesterhaus, Detmold (DE);
Matthias Boensch, Bielefeld (DE);
Matthias Niggemann, Lemgo (DE);
Michael Lenschen, Detmold (DE);
Stephan Fehling, Lage (DE); Torsten Diekmann, Leopoldshoehe (DE)

(73) Assignee: Weidmueller Interface GmbH & Co. KG, Detmold (DE)

( * ) Notice: Subject to any disclaimer, the term of this patent is extended or adjusted under 35 U.S.C. 154(b) by 0 days.

(21) Appl. No.: 12/322,889

(22) Filed: Feb. 9, 2009

(65) Prior Publication Data

US 2009/0209122 A1    Aug. 20, 2009

(30) Foreign Application Priority Data

Feb. 14, 2008    (DE) .................. 20 2008 002 111 U

(51) Int. Cl.
*H01R 13/62*    (2006.01)
(52) U.S. Cl. ..................................... 439/157
(58) Field of Classification Search .................. 439/157
See application file for complete search history.

(56) References Cited

U.S. PATENT DOCUMENTS 5,435,738 A * 7/1995 Isohata ....................... 439/157
6,471,527 B2 * 10/2002 Fukamachi et al. ......... 439/157

* cited by examiner

*Primary Examiner*—Tho D Ta
(74) *Attorney, Agent, or Firm*—Lawrence E. Laubscher, Sr.; Lawrence E. Laubscher, Jr.

(57) ABSTRACT

A connector assembly for printed circuit board terminal blocks and the like includes a housing having spaced side and end walls defining a chamber, and a first connector component mounted in the chamber adjacent an access opening contained in the housing walls. A second connector component external of the housing is displaceable between an engaged position in electrical engagement with the first connector component, and a disengaged position disengaged from the first component. A separating lever pivotally connected with the second connector component includes a cam arrangement that cooperates with the housing side walls to displace the second connector component from the engaged position toward the disengaged position relative to the first connector component. A locking arrangement may be provided for locking together the connector components in the electrically engaged condition.

6 Claims, 4 Drawing Sheets

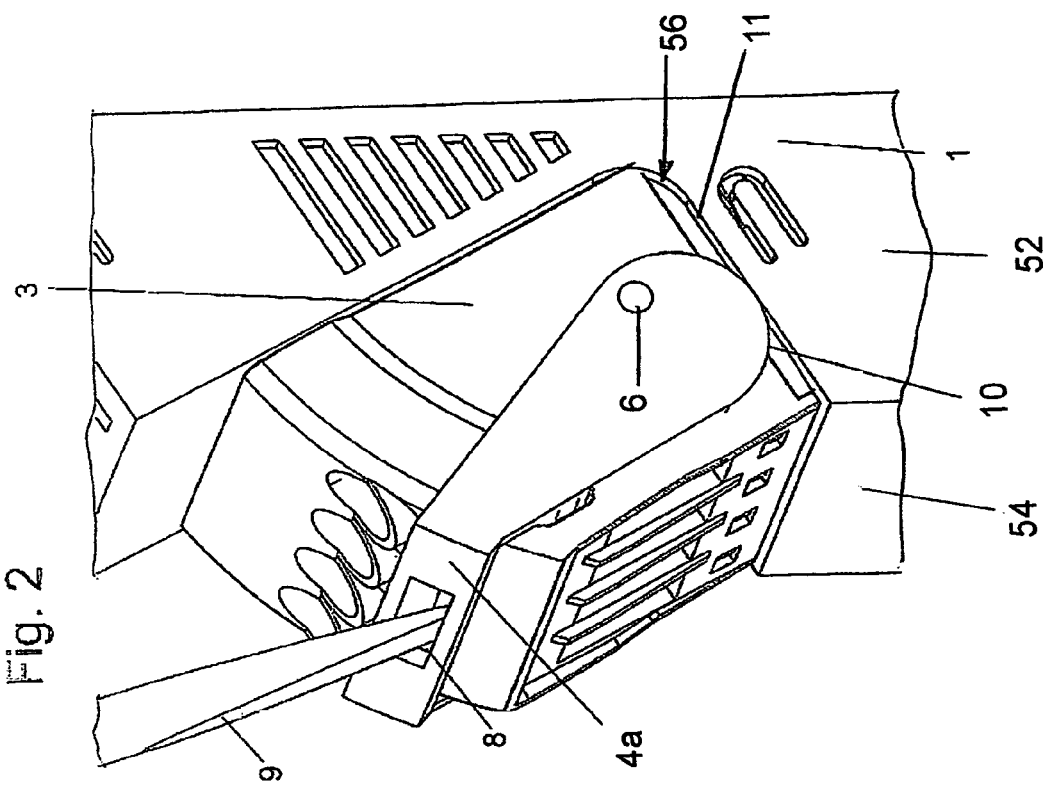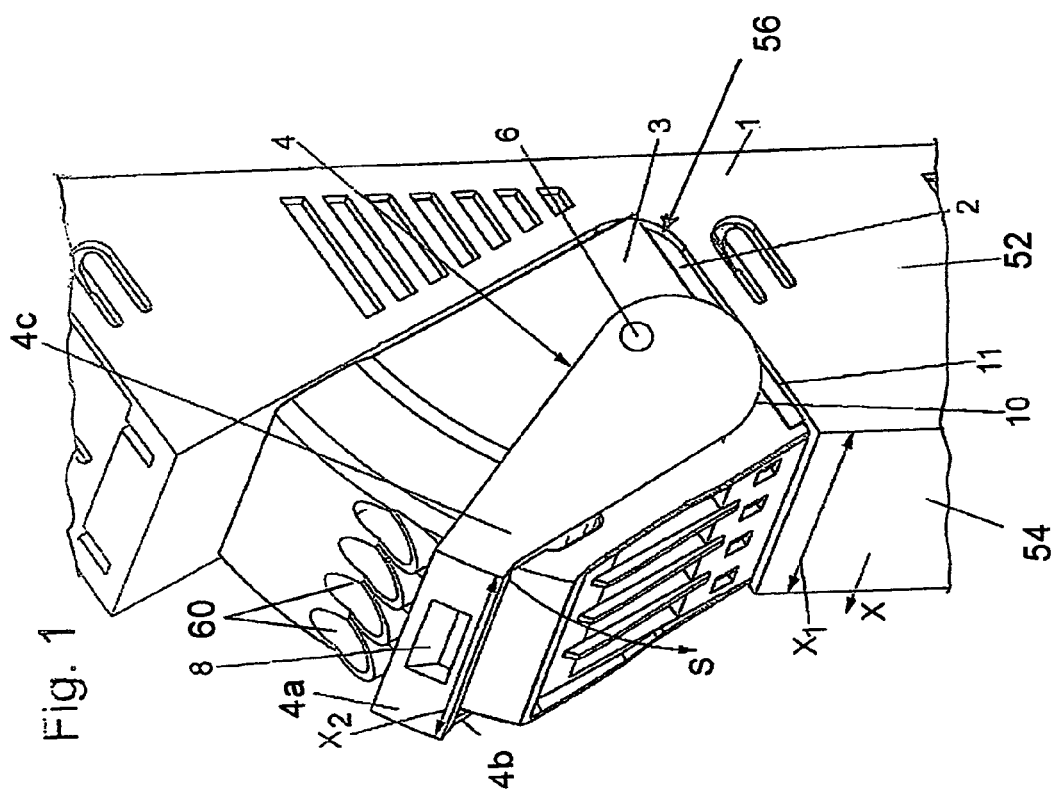

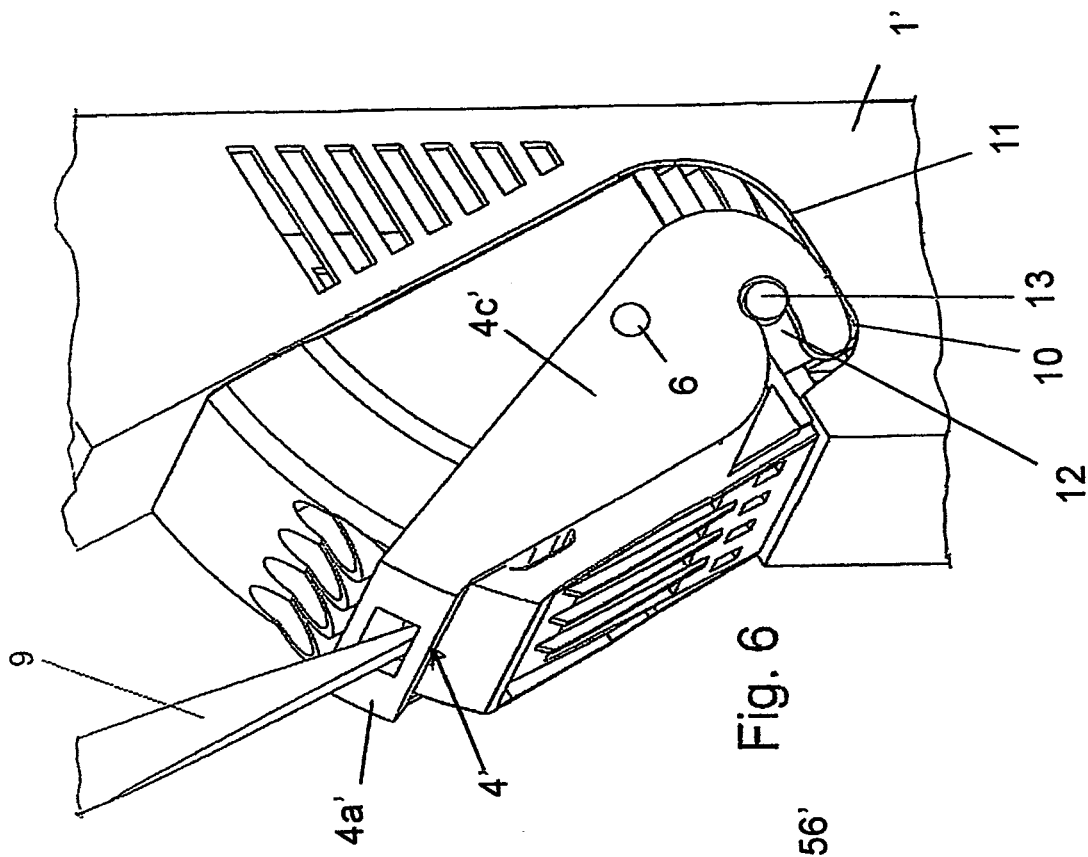
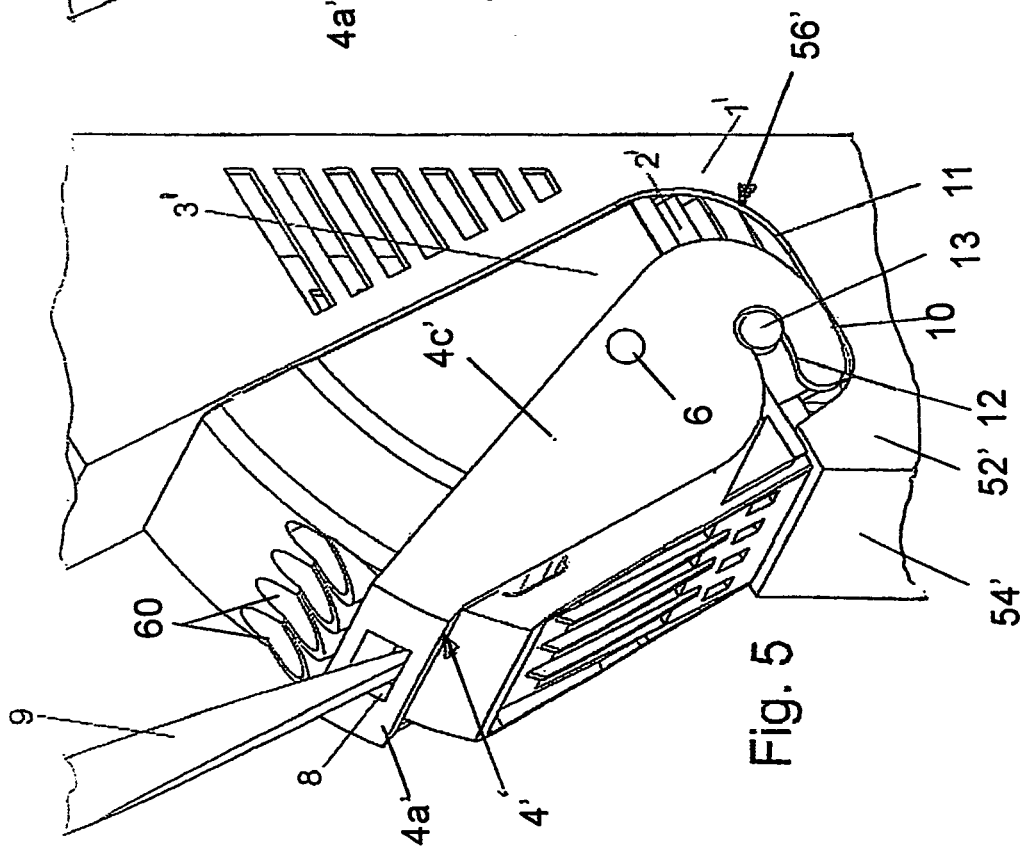

STACKABLE ELECTRONIC HOUSING WITH MALE OR FEMALE CONNECTOR STRIPS

REFERENCE TO RELATED APPLICATIONS

This application is related to the Heggemann et al applications Ser. No. 12/322,673 filed Feb. 5, 2009, entitled "Electronic Housing With a Conductive Plate, and Method for Manufacturing the Same", Ser. No. 12/320,856 filed Feb. 6, 2009, entitled "Connector Apparatus With Code Means, and Method of Assembling the Same", and Ser. No. 12/320,854 filed Feb. 6, 2009, entitled "Housing for Electrical Components".

BACKGROUND OF THE INVENTION

1. Field of the Invention

A connector assembly for printed circuit board terminal blocks and the like includes a housing having spaced side and end walls defining a chamber, a first connector component mounted in the chamber adjacent an access opening contained in the housing walls, and second connector component displaceable externally of the housing between an engaged position adjacent and in electrical engagement with the first connector component, and a disengaged position electrically disengaged from the first component. Separating lever mean pivotally connected with the second connector component cooperate with the housing side walls to displace the second connector component from the engaged position toward the disengaged position relative to the first connector component. Locking means may be provided for locking together the connector components in the electrically engaged condition.

2. Description of Related Art

The present invention relates to a stackable terminal block housing for printed circuit boards and the like designed for mounting on a mounting rail and including at least one male or female multi-contact connector component having a plurality of transversely arranged contacts.

It is known that one or more male connector strips and/or female connector component may be arranged on a printed circuit board and can be plugged together with a corresponding female connector component and/or male connector component. In particular in the design of the electronic housing as a terminal block module adapted for mounting on a mounting rail, the installation conditions are usually very constricted. In this case it is often relatively tedious to separate male and female connector strips from one another after they have been joined together.

The present invention was developed to avoid this problem by using simple design means, use being made of separating means to effect simplified disengagement of a pair of electrically connected connector components.

SUMMARY OF THE INVENTION

Accordingly, a primary object of the present invention is to provide a relatively thin printed circuit terminal block that is adapted for stackable mounting on a mounting rail, including a housing, a first connector component mounted in a chamber contained in said housing, a second connector component arranged outside the housing in a connected position in electrical engagement with said first component, and separating means for displacing said second connector component toward a disengaged position relative to said first component.

According to a more specific object of the invention, the separating means includes a separating lever pivotally connected with the second connector component, said lever carrying cam means arranged for engagement with a companion linear surface on the housing for displacing the second connector component toward the disengaged position relative to said first connector component.

A further object of the invention is to provide locking means associated with the separating lever for locking together the connector components in an electrically engaged condition when the lever is in its initial position effecting engagement between the connectors. The unlocking means provides for the release of the plug connection between the male and female connector strips in a simple manner. Unlocking is thus understood to refer at least to support of separation of the two elements, the male and female connector strips, from one another. In accordance with an important feature of the invention, it also does not increase the overall width of the actual housing in an advantageous manner, in particular the electronic housing in the direction of alignment, so that it is excellently suited for use in terminal strip-type housings.

Only one or more male and/or female connector strips may be arranged on the electronic housing. Preferably one of the unlocking devices is assigned to each such terminal strip. It is also possible to ensure a secure connection between the male and female connectors and/or electric contacts even after prolonged use in the installed state, e.g., in the rough environment on a machine or the like.

BRIEF DESCRIPTION OF THE DRAWINGS

Other objects and advantages of the invention will become apparent from a study of the following specification, when viewed in the light of the accompanying drawing, in which:

FIG. 1 is a perspective view of a first embodiment of the invention when in the initial electrically connected state;

FIG. 2 illustrates an operating tool being inserted in to the operating slot of the separating lever of FIG. 1;

FIG. 5 is a perspective view of a modification of the invention wherein locking means are provided for locking the connector components together in the electrically engaged condition;

FIG. 6 illustrates the insertion of the tip of an operating tool into the operating slot of the separation lever of the embodiment of FIG. 5;

DETAILED DESCRIPTION OF THE INVENTION

Figure 3:
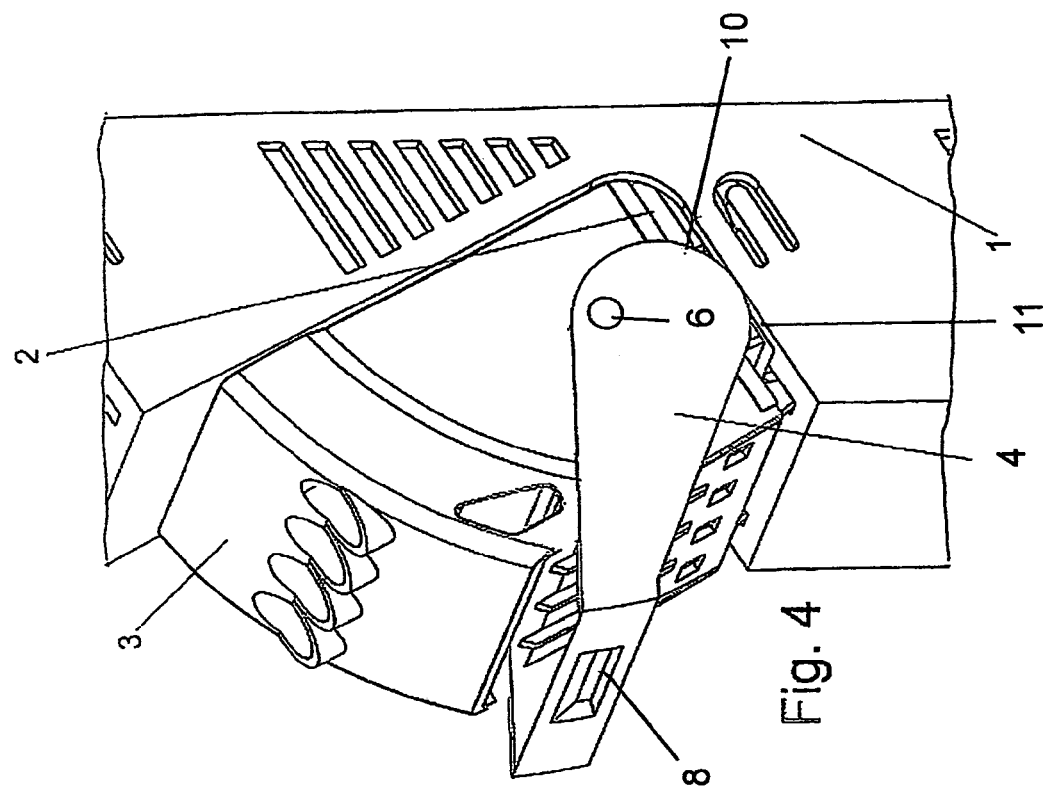
FIG. 3 illustrated the separating leaver when operated by the tool toward the disengaged position.

Referring first more particularly to FIG. 1, the connector apparatus of the present invention includes a housing 1 having vertical side and end walls 52 and 54 defining a chamber in which is mounted a first connector component 2 adjacent a wall access opening 56 provided in the housing. This first connector component includes contacts in engagement with the circuit contacts of a printed circuit board (not shown) mounted in the housing chamber, as is known in the art. A companion second connector component 3 is arranged externally of the housing 1 in electrical engagement with the first component 2. The two companion components are multi-contact components each including a plurality of contacts arranged in a row transverse to the housing, the second component 3 containing a series of conductor openings 60 affording access to the respective connector contacts.

Figure 4:
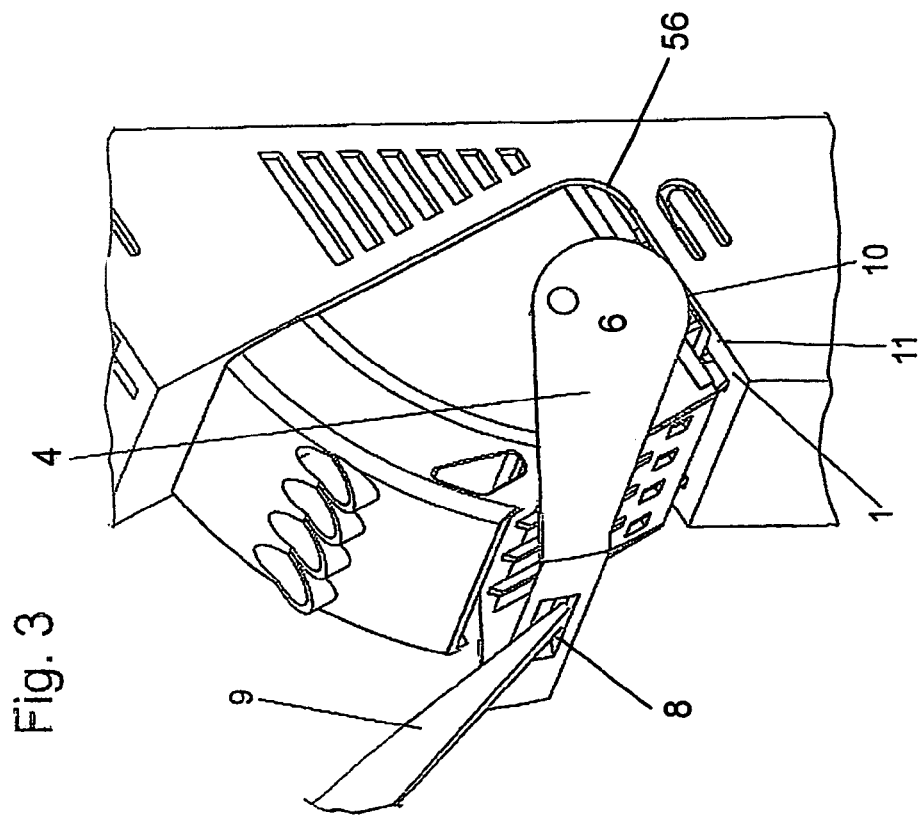
FIG. 4 shows the separating lever and the second connector component when in the final disengaged position.
Figure 8:
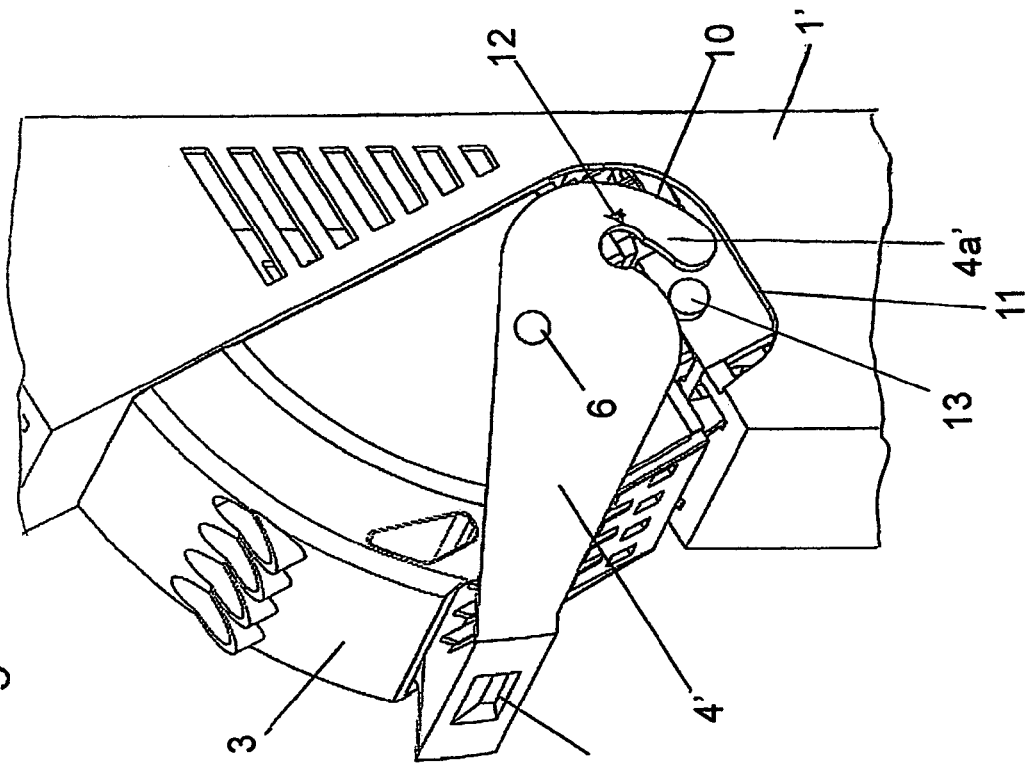
FIG. 8 illustrates the separating lever when in its final unlocked position effecting disengagement of the connector components.
Figure 7:
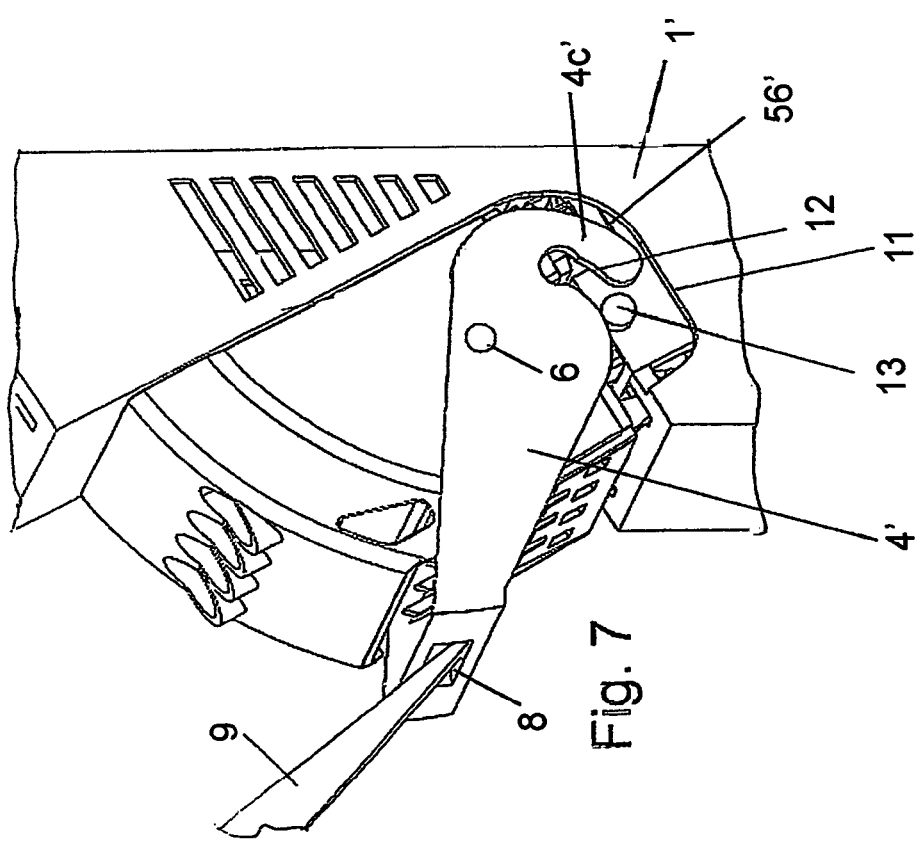
FIG. 7 illustrated the separating lever when pivoted by the operating tool toward the disengaged and unlocked position.

According to a characterizing feature of the invention, separating means including a pivotally operable separating lever 4 are provided for displacing the second connector component 3 from the engaged position of FIG. 1 toward the disengaged position of FIG. 4. The separating lever 4 has a generally U-shaped configuration defining a transverse portion 4a that extends transversely of the second connector component on the side thereof remote from the first component, and a pair of parallel leg portions 4b, 4c that extend on opposite sides of the second connector component. The free ends of the leg portions are pivotally connected with the second connector component for displacement about the transverse pivot axis 6. The end surfaces of the leg portions are provided with eccentric cam surfaces 10 arranged for engagement with linear reaction surfaces 11 on the housing adjacent the housing opening 56. Consequently, when the tip of a screwdriver 9 or the like is inserted into the operating slot 8 provided in the transverse portion 4a of the separating lever 4, the lever is caused to pivot in the counterclockwise direction S, whereby cam surface 10 reacts with fixed housing surface 11 to displace connector component 3 upwardly, thereby to separate and electrically disengage the second component 3 from the first connector component 2. The connector component and the conductors (not shown) associated therewith is then removed from terminal block housing 1.

It is important to note from FIG. 1 that in accordance with an important feature of the invention, the terminal block corrector arrangement has a relatively thin thickness, with the width dimension $X_2$ of the lever being no greater than the housing width dimension $X_1$. Consequently, the maximum number of terminal blocks may be mounted in stacked side-by-side relation on any given support rail.

Referring now to the embodiment of FIGS. 5-8, in accordance with another important feature of the invention, locking means are provided for locking the second connector component 3' to the first component 2' when the components are in the engaged condition of FIG. 5. To this end, the housing opening 56' is enlarged to expose to a greater extent the protruding upper portion of the first component 2', which protruding portion carries on its opposite sides a pair of locking pins 13. The locking pins 13 extend respectively into corresponding locking slots 12 contained in the end portions of the separating lever leg portions between the pivot pins 6 and the cam surfaces 10. The configuration of the locking slots 12 is such that as the separating lever is pivoted in the counter-clockwise direction by the tool 9 from the engaged position of FIG. 5 toward the disengaged position of FIG. 8, the locking pin 13 is removed from the locking slot 12, thereby to release the component 3 for removal from the assembly. When the lever 4' is pivoted in the clockwise direction from the position shown in FIG. 8, the locking pins cooperate with the cam surfaces on the locking slots 12 to displace the second component 3' toward the first component 2', and then to lock the components together as shown in FIG. 5.

While in accordance with the provisions of the Patent Statutes the preferred forms and embodiments of the invention have been illustrated and described, it will be apparent to those skilled in the art that changes may be made without deviating from the invention described above.

What is claimed is:

1. A connector assembly, comprising:
   (a) a generally-rectangular housing (1; 1') including a plurality of side (52; 52') and end (54; 54') walls defining a chamber;
   (b) a first electrical connector component (2) mounted in said chamber, said housing walls containing an access opening (56; 56') affording access to the contacts of said first connector component;
   (c) a second connector component (3) arranged outside said housing, said second connector component being displaceable between an engaged position adjacent and in electrical engagement with said first connector component, and a disengaged position remote from said first connector component; and
   (d) separating means (4) for displacing said second connector component from said engaged position toward said disengaged position, said separating means including:
      (1) a separating lever (4; 4') pivotally connected with said second connector component, said separating lever has a generally U-shaped configuration defining a transverse portion (4a; 4b) extending transversely across said second connector component remote from said first connector component, and a pair of leg portions (4b; 4b') extending from said transverse portion on opposite sides of said second connector component;
      (2) pivot means (6) connecting said leg portions with said second connector component for pivotal movement about a common pivot axis (6); and
      (3) cam means (10) arranged on said separating lever for cooperation with a fixed surface (11) on said housing, said cam means comprising cam surfaces (10) carried by the end surfaces of said separating lever leg portions for cooperation with corresponding generally linear surfaces (11) arranged on said housing adjacent said housing opening, said cam surfaces being eccentric relative to said pivot axis such that pivotal movement of said separating lever in one direction from an initial first position toward a second position causes said second connector component to be axially displaced from said engaged position toward said disengaged position relative to said first connector component.

2. A connector assembly as defined in claim 1, wherein said separating lever transverse portion contains an operating slot (8) arranged to receive the tip of an operating tool (9).

3. A connector assembly as defined in claim 1, and further including locking means (12, 13) for locking together said first and second connector components when said component are in the electrically engaged condition.

4. A connector assembly as defined in claim 3, wherein said locking means includes a pair of locking pins (13) extending outwardly from opposite sides of said first connector component for cooperation with corresponding locking slots (12) contained in said separating lever leg portions, the configurations of said locking slots being such that said pins are removed from said slots when said separating lever is pivoted from said first position toward said second position.

5. A connector assembly as defined in claim 1, wherein the distance ($X_2$) between the outer surfaces of said separating lever leg portions is no greater than the width ($X_1$) of said housing.

6. A connector assembly as defined in claim 5, wherein said first and second connector component are multi-contact plug and socket components the contacts of which are serially arranged transversely of said housing.

* * * * *